(12) United States Patent
Hiblot et al.

(10) Patent No.: US 10,825,806 B2
(45) Date of Patent: Nov. 3, 2020

(54) SEMICONDUCTOR INTEGRATED CIRCUIT MANUFACTURED USING A PLASMA-PROCESSING STEP

(71) Applicant: IMEC vzw, Leuven (BE)

(72) Inventors: Gaspard Hiblot, Heverlee (BE); Geert Van der Plas, Leuven (BE); Stefaan Van Huylenbroeck, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/215,492

(22) Filed: Dec. 10, 2018

(65) Prior Publication Data
US 2019/0181133 A1 Jun. 13, 2019

(30) Foreign Application Priority Data
Dec. 11, 2017 (EP) .................................... 17206476

(51) Int. Cl.
| | | |
|---|---|---|
| H01L 27/02 | (2006.01) | |
| H01L 21/3065 | (2006.01) | |
| H01L 21/768 | (2006.01) | |
| H01L 23/48 | (2006.01) | |
| H01L 23/60 | (2006.01) | |

(52) U.S. Cl.
CPC ...... *H01L 27/0259* (2013.01); *H01L 21/3065* (2013.01); *H01L 21/76898* (2013.01); *H01L 23/481* (2013.01); *H01L 23/60* (2013.01); *H01L 27/0292* (2013.01)

(58) Field of Classification Search
CPC . H01L 27/0259; H01L 27/0292; H01L 23/60; H01L 23/62; H01L 21/3065
See application file for complete search history.

(56) References Cited

U.S. PATENT DOCUMENTS

| | | | |
|---|---|---|---|
| 6,417,544 B1 | 7/2002 | Jun et al. | |
| 2001/0026970 A1* | 10/2001 | Eitan | .................... H01L 27/0251 |
| | | | 438/215 |
| 2006/0226485 A1 | 10/2006 | Arakawa | |
| 2012/0175708 A1 | 7/2012 | Schuetz et al. | |
| 2019/0237459 A1* | 8/2019 | Hiura | .................. H01L 27/0259 |

FOREIGN PATENT DOCUMENTS

| | | |
|---|---|---|
| EP | 1061580 A2 | 12/2000 |
| EP | 1061580 A3 | 5/2001 |
| JP | 2018-64008 A * | 4/2018 |

OTHER PUBLICATIONS

Extended Search Report in application EP17206476.8, EPO counterpart to this application, dated May 25, 2018.

* cited by examiner

*Primary Examiner* — Hsien Ming Lee
(74) *Attorney, Agent, or Firm* — Knobbe Martens Olson & Bear, LLP

(57) ABSTRACT

The disclosed technology relates to a semiconductor integrated circuit that comprises a semiconductor device which has a port to be protected from Plasma-Induced Damage due to electric charge that may accumulate at the port during a plasma-processing step, and a protection circuit that is provided to the integrated circuit. In one aspect, the protection circuit comprises a discharge path, a control terminal, and a plasma pick-up antenna connected to the control terminal. The protection circuit further comprises a bipolar transistor which has a base connected to the control terminal. Such protection circuit is much more efficient in allowing charge transfer from the device port to a reference voltage terminal.

27 Claims, 6 Drawing Sheets

SEMICONDUCTOR INTEGRATED CIRCUIT MANUFACTURED USING A PLASMA-PROCESSING STEP

CROSS-REFERENCE TO RELATED APPLICATIONS

This application claims foreign priority to European Application EP 17206476.8, entitled "SEMICONDUCTOR INTEGRATED CIRCUIT MANUFACTURED USING A PLASMA-PROCESSING STEP," filed on Dec. 11, 2017, which is incorporated herein by reference in its entirety.

BACKGROUND

Technological Field

The disclosed technology relates to a semiconductor integrated circuit which is manufactured using a plasma-processing step.

Description of the Related Technology

In the sequence implemented to manufacture a semiconductor integrated circuit, at least one plasma-processing step may be performed after MOS-transistors of the circuit have been produced. Such sequence occurs in particular when the MOS-transistors are located at a front surface of a silicon wafer which is used for the circuit, and, for example, when a through-silicon via is to be produced from the back surface of the wafer. Then it is a major objective that the plasma-etching process which is implemented to form a through-hole in the wafer does not damage the MOS-transistors of the circuit. Such damage is commonly called Plasma-Induced Damage, or PID, and is due to an excessive electric charge that is injected by the plasma onto a metal portion of the circuit when the wafer is being processed. This excessive charge may lead to excessive voltage stress over the gate of the MOS-transistor and force a current through a MOS transistor gate which is connected to the metal portion, and therefore induce damage on the gate oxide of the MOS transistor. Such phenomenon is well-known, and many attempts have been carried out to provide protection against the Plasma-Induced Damage. However, the protection efficiency decreases when the circuit pitch becomes smaller, and also, for example, when the aspect ratio of the hole or trench which is plasma-etched is higher.

In particular, document U.S. Pat. No. 6,417,544 discloses a semiconductor integrated circuit which comprises: a semiconductor device having a port to be protected from Plasma-Induced Damage due to the electric charge that may accumulate at this port during a plasma-processing step which is applied to the semiconductor integrated circuit; a protection circuit comprising: a discharge path which is arranged to electrically connect the port to a reference voltage terminal; and a control terminal, which is adapted to activate or deactivate the discharge path, so that the electric charge is respectively allowed to flow or prevented from flowing from the port to the reference voltage terminal through the discharge path; and a plasma pick-up antenna which is connected to the control terminal and arranged to be biased during the plasma-processing step.

In the circuit disclosed by document U.S. Pat. No. 6,417,544, the discharge path comprises a Zener diode which is provided with a gate as the control terminal. This gate produces a lowering of a breakdown voltage of the Zener diode, based on a plasma potential which is sensed by the plasma pick-up antenna. But the efficiency in protecting the port of the semiconductor device depends on the capability of the diode to conduct the electric charge from this port during the plasma treatment with sufficient current value. This may require a large area diode, or several diodes in parallel, in particular when the Zener is to evacuate the electric charge in reverse diode mode. In addition, such protection is not applicable to the most advanced CMOS technologies, since the breakdown voltage of the Zener diode cannot be lowered enough compared to the damaging potential values which are effective for MOS-transistors in the most advanced technologies.

In addition, in the circuit of document U.S. Pat. No. 6,417,544, the oxide layer of the gated diode is connected to both the device port to be protected and the plasma pick-up antenna. Because of this, damage that is caused by the plasma-processing step to the oxide layer of the gated diode may create significant leakage current to occur during the normal operation of the device. In all cases, leakage currents through diode junctions add for all the diodes which are provided to temporary protect the device port during the plasma-processing step.

Starting from this situation, one objective of the disclosed technology is to propose a new semiconductor integrated circuit which suppresses or at least reduces the Plasma-Induced Damage described above, in a greater extent compared to prior art.

In particular, the disclosed technology aims at providing a device protection against Plasma-Induced Damage which is efficient even for the most advanced circuit technologies.

An additional objective of the disclosed technology is that the protection does not necessitate much wafer area in addition to the useful semiconductor device.

Still another objective of the disclosed technology is that providing the protection does not necessitate costly additional manufacturing step, and does not increase significantly the unit price of the semiconductor device.

Still another objective of the disclosed technology is to provide protection to the semiconductor device while not creating significant additional leakage current which would be effective during normal operation of the semiconductor device.

SUMMARY OF CERTAIN INVENTIVE ASPECTS

For meeting at least one of these objectives or others, a first aspect of the disclosed technology proposes a semiconductor integrated circuit as recited above, which comprises the semiconductor device having a port to be protected from the Plasma-Induced Damage, and the protection circuit including the discharge path, the control terminal for activating or deactivating the discharge path, and plasma pick-up antenna connected to the control terminal. According to the disclosed technology, the plasma pick-up antenna is arranged to accumulate additional electric charge during the plasma-processing step, and the protection circuit further comprises a bipolar transistor, with a base thereof which is connected to the control terminal. In this way, when the plasma pick-up antenna accumulates the additional electric charge, the control terminal is biased and the discharge path is activated, thereby protecting the port of the semiconductor device.

So, the additional electric charge which is accumulated at the plasma pick-up antenna produces a bias of the base of the bipolar transistor. This bias then allows the charge transfer from the device port to the reference voltage terminal.

Thanks to the current gain of the bipolar transistor, the control terminal is more efficient in allowing the charge transfer from the device port to the reference voltage terminal. In particular, the protection based on bipolar transistor is more sensitive to the bias of the plasma pick-up antenna than a diode-based protection. Furthermore, the current gain of the bipolar transistor allows this bipolar transistor to be small in terms of wafer area occupied, considering that this wafer area which is occupied by the bipolar transistor is useless with regard to the intended operation of the semiconductor device. More wafer area is thus available for components which participate in the intended operation of the device.

Another advantage of the circuit results from the fact that no thin device dielectric layer, for example, MOS gate oxide, is coupled to the control terminal of the discharge path. In this way, after a plasma-processing step, no damage related to such dielectric layer should exist, thereby avoiding that excessive leakage current can flow from the device port through the plasma pick-up antenna during the intended operation of the semiconductor device. Put another way, because the bipolar transistor has no oxide layer, it is not damaged during the plasma-processing step, so that no significant additional leakage current is created by the protection system of the disclosed technology.

The integrated semiconductor circuit which is claimed further corresponds to a circuit state as existing during the circuit manufacturing sequence, before or during the plasma-processing step so that the protection against the Plasma-Induced Damage is efficient during the plasma-processing step.

Preferably, the discharge path may comprise at least one path segment which is formed of a drain-to-source path of a MOS transistor or of a collector-to-emitter path of a bipolar transistor. Such path segments have very low resistance values, so that the discharge path is more efficient for sinking the electric charge due to the plasma-processing, from the device port.

Various embodiments of the disclosed technology may involve the following combinations: the port to be protected comprises a gate of an N-MOS-transistor, and the bipolar transistor which has its base connected to the control terminal is of PNP type; the port to be protected comprises a gate of an P-MOS-transistor, and the bipolar transistor which has its base connected to the control terminal is of NPN type; the port to be protected comprises a gate of an N-MOS-transistor, and the bipolar transistor which has its base connected to the control terminal is of NPN type; or the port to be protected comprises a gate of an P-MOS-transistor, and the bipolar transistor which has its base connected to the control terminal is of PNP type.

These combinations are optimized based on doping considerations for doped regions forming both the MOS-transistor to be protected and the bipolar transistor intended to provide the protection, depending on their respective types. In addition, several of the above-listed combinations may also be implemented within one and same circuit, for example, to protect MOS-transistors of N- and P-types existing simultaneously within the device.

Generally, the discharge path may comprise additional transistors further to the bipolar transistor which has its base connected to the control terminal. Such additional transistors may be then combined with the bipolar transistor which has its base connected to the control terminal, to form a discharge path which has a higher capacity, in particular in terms of current for the electric charge to be sunk from the device port. Each of such additional transistors may be either of a bipolar type or a MOS type.

Generally for the disclosed technology, the semiconductor integrated circuit may further comprise a metal connection which is arranged to short the base of the bipolar transistor that has its base connected to the control terminal, to an emitter of this bipolar transistor. In this case, the claimed circuit corresponds to a state of the circuit after the plasma-processing. Indeed, protection against Plasma-Induced Damage is no longer necessary for the circuit, and the shorting of the base of the bipolar transistor to its emitter ensures that the discharge path is definitively inhibited from conducting any electric charge from the device port to the reference voltage terminal.

In possible circuit configurations, the semiconductor integrated circuit may comprise at least one substrate which is provided with at least one through-substrate via. Then, thanks to the disclosed technology, this through-substrate via may be located within the semiconductor integrated circuit so that plasma-processing the substrate to produce the through-substrate via causes electric charge to accumulate at the port of the semiconductor device, and the additional electric charge to accumulate at the plasma pick-up antenna. For such circuit configuration, after plasma-processing, the metal connection which shorts the base of the bipolar transistor to its emitter may be located on a backside of the substrate of the semiconductor integrated circuit, which is opposite a front side of the substrate where the semiconductor device is located. Such embodiment of the disclosed technology may be useful for producing a so-called 3D-circuit, which is comprised of several semiconductor device parts that are located at separate substrate faces, and at least one of the semiconductor device parts being connected electrically to another one using at least one through-substrate via.

A further aspect of the disclosed technology proposes a process of manufacturing a semiconductor integrated circuit which comprises a semiconductor device having a port to be protected from Plasma-Induced Damage due to electric charge that may accumulate at this port during a plasma-processing step which is applied to the semiconductor integrated circuit, and a protection circuit that is provided to the integrated circuit. Such process comprises the following steps: 1) forming a protection circuit as part of the semiconductor integrated circuit, this protection circuit comprising:

- a discharge path, which is arranged to electrically connect the port to a reference voltage terminal; and
- a control terminal, which is adapted to activate or deactivate the discharge path, so that the electric charge is respectively allowed to flow or prevented from flowing from the port to the reference voltage terminal through the discharge path; and
- a plasma pick-up antenna, which is connected to the control terminal, and thereafter:

2) plasma-processing the semiconductor integrated circuit.

According to the disclosed technology, the plasma pick-up antenna is arranged so that it accumulates additional electric charge during step 2). In addition, the protection circuit further comprises a bipolar transistor, which has a base connected to the control terminal. In this way, when the plasma pick-up antenna accumulates the additional electric charge in step 2), the control terminal is biased and the discharge path is activated, thereby protecting the port of the semiconductor device.

In particular, step 2) of the process may be a plasma-etching step.

Such process may be implemented to manufacture a semiconductor integrated circuit which is in accordance with the first inventive aspect, including its exemplary embodiments and cited combinations.

Generally for the disclosed technology, the semiconductor integrated circuit may further comprise a metal portion which is located within this circuit and cause the electric charge to be transmitted to the port of the semiconductor device during the plasma-processing of step 2). Such metal portion may exist in the circuit before step 2), or being produced or modified during step 2), or being exposed to the plasma from one time during the plasma-processing of step 2).

Also generally for the disclosed technology, the process may further comprise the following step which is carried out after step 2): 3) electrically shorting the emitter of the bipolar transistor to the base of this bipolar transistor.

In this way, the discharge path is definitively deactivated after the plasma-processing step, so that it will not interfere with the intended operation of the device after its processing. Indeed, once the emitter and the base of the bipolar transistor are shorted electrically, the emitter-base junction is inhibited and the bipolar transistor behaves like a diode, whose polarity is the same as the base-collector junction. Under normal circuit bias conditions, this diode is in blocked state, with its leakage current being low enough not to produce significant energy consumption during normal operation of the device.

Another advantage of the disclosed technology is that the device does not incur any risk to be damaged during step 3), since the discharge path is deactivated without involving any fuse to be melted. Indeed, melting fuses as commonly implemented to inhibit circuit parts requires applying high voltage or high current which may cause damage to the circuit.

The circuit manufacturing process of the disclosed technology may already comprise at least one metallisation step after step 2), so that producing a metal connection to short the emitter and base of the bipolar transistor does not introduce additional circuit manufacturing steps.

When the semiconductor integrated circuit comprises at least one substrate, the plasma-etching step may be performed to produce at least one through-substrate via. Then, this through-substrate via may be located within the semiconductor integrated circuit so that plasma-etching the substrate may cause the electric charge to accumulate at the port of the semiconductor device, and the additional electric charge to accumulate at the plasma pick-up antenna. In such case, a metal connection which is arranged in step 3) after the plasma-processing to short the emitter of the bipolar transistor to its base may be located on a backside of the substrate of the semiconductor integrated circuit, which is opposite a front side of this substrate where the semiconductor device is located.

These and other features of the disclosed technology will be now described with reference to the appended figures, which relate to exemplary but not-limiting embodiments of the disclosed technology.

BRIEF DESCRIPTION OF THE DRAWINGS

For clarity sake of the below explanations, same reference numbers which are indicated in different ones of these figures denote identical elements of elements with identical function.

DETAILED DESCRIPTION OF CERTAIN ILLUSTRATIVE EMBODIMENTS

In the figures, reference number 10 generally denotes a circuit substrate which is currently being plasma-processed. To this end, plasma is produced above a surface BS of the substrate 10. In a well-known manner, the substrate 10 comprises a semiconductor wafer 101, which may be covered at its surface BS by a layer 102 of an insulating material, for example, a silica ($SiO_2$) layer. The wafer 101 may be a semiconductor wafer, for example, a silicon wafer.

Figure 2A:
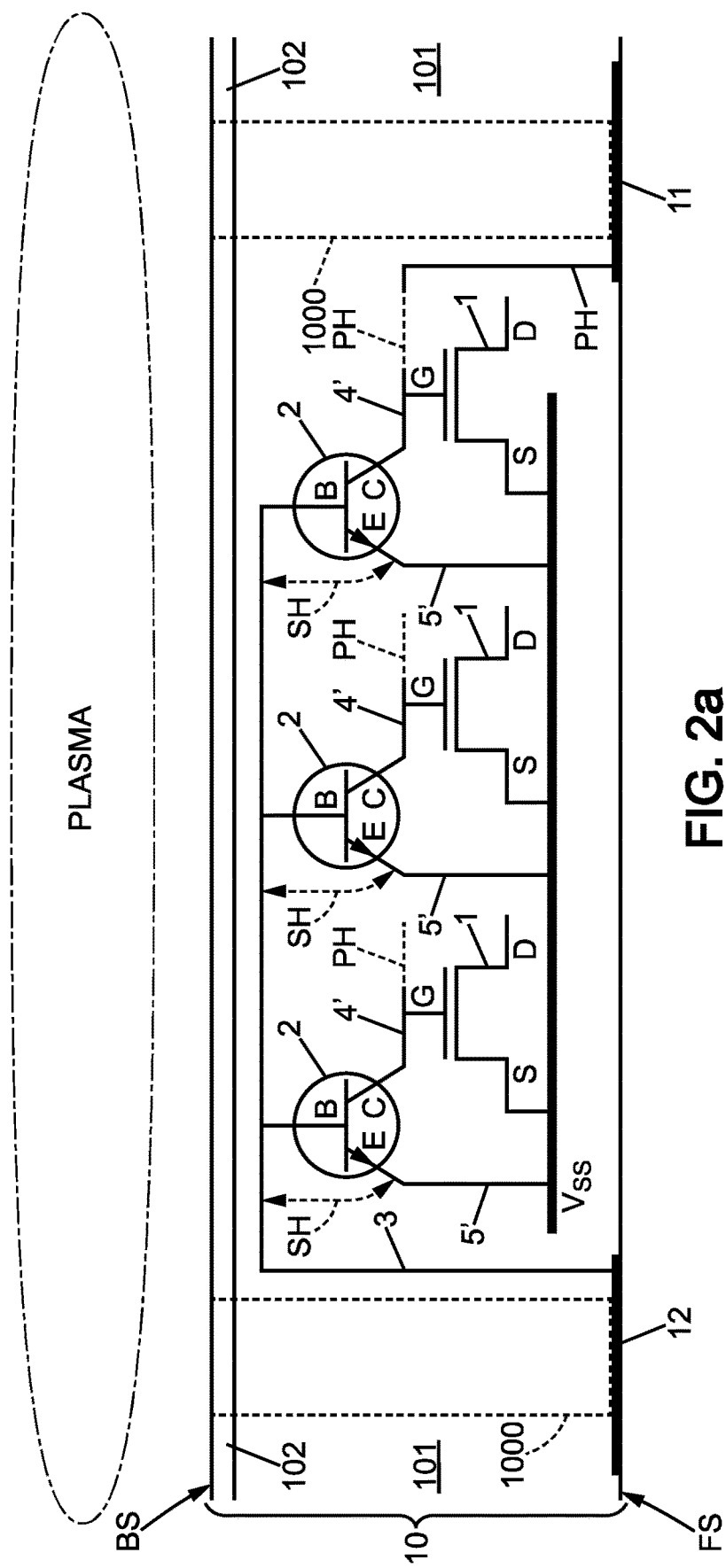
FIG. 2A is an electrical diagram of a semiconductor integrated circuit in accordance with another possible embodiment of the disclosed technology.
Figure 2B:
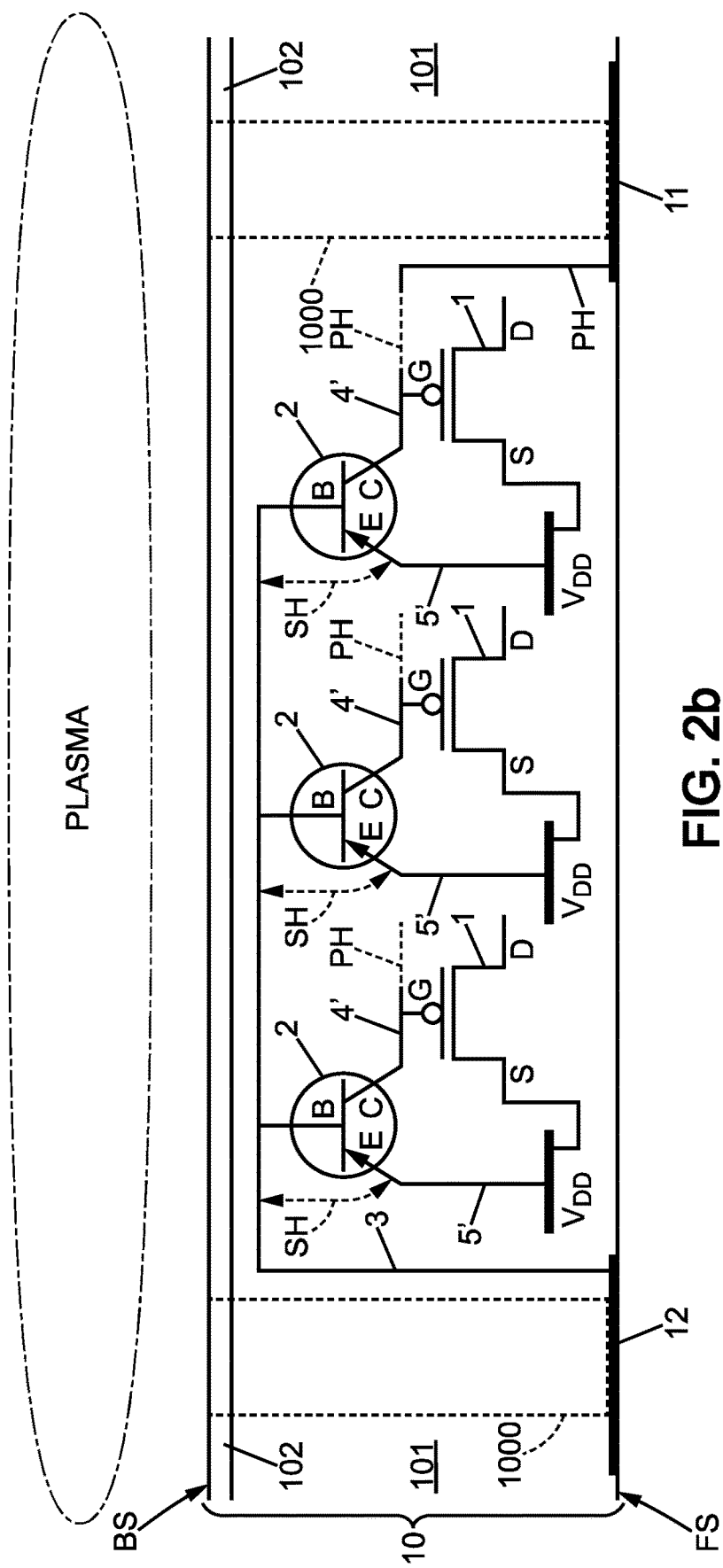
FIG. 2B corresponds to FIG. 2A for a dual embodiment.

A semiconductor device which is part of the circuit comprises at least one port, such as a gate of a MOS-transistor 1, or gates of several MOS-transistors (FIGS. 2A and 2B). Obviously, the semiconductor device also comprises other components that are not shown as they are not directly concerned with the disclosed technology. Such device is formed on a front side surface FS of the substrate 10. Then, the surface BS of the substrate 10 may be the substrate back side surface, which is opposed the front side surface FS.

The plasma-processing of the circuit substrate 10 may be a plasma-etching process which is implemented to form several holes 1000 through the silicon wafer 101 from the back side surface BS. In a well-known manner, the back side surface BS has to be provided with a suitable mask to define the cross-sections of the through-silicon holes. Alternatively, the etching step may be intended to remove bottom parts of a liner layer which have been formed within through-substrate holes produced beforehand.

A metal portion 11 may be located at the front side surface FS of the substrate 10 close to one of the holes 1000 to be etched, or at the bottom of this hole. Then, electric charge may be captured during the plasma-etching step by the exposed metal portion 11 and transferred, through other already existing connections, to the MOS-transistor gate(s) which form(s) the device port(s) to be protected. When such electric charge becomes excessive, the gate oxide layer of the connected MOS-transistor of the device, or of some of them, may be damaged. Due to the damaged MOS-transistor(s) the device will not operate correctly. It is an issue addressed by the disclosed technology to avoid such Plasma-Induced Damage to the gate oxide layers, by forcing the electric charge to flow, through the discharge path, away from the gate(s) of the MOS-transistor(s) of the semiconductor device. In the figures, a charge accumulation path PH is drawn for illustrative purpose from the metal portion 11 to the gate of each MOS-transistor 1, although such path may or may not correspond to an actual metal connection.

Figure 1A:
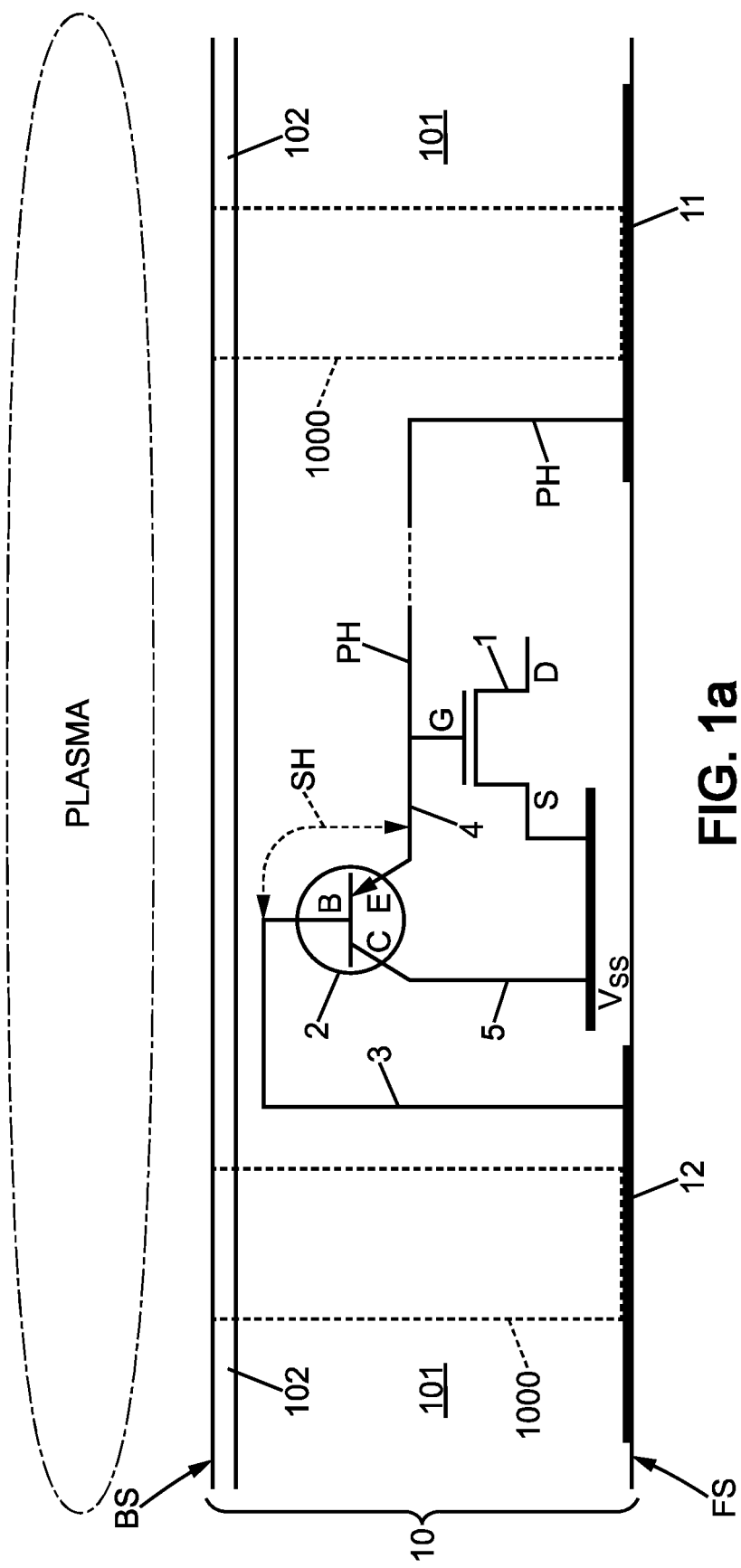
FIG. 1A is an electrical diagram of a semiconductor integrated circuit in accordance with a possible embodiment of the disclosed technology.
Figure 1B:
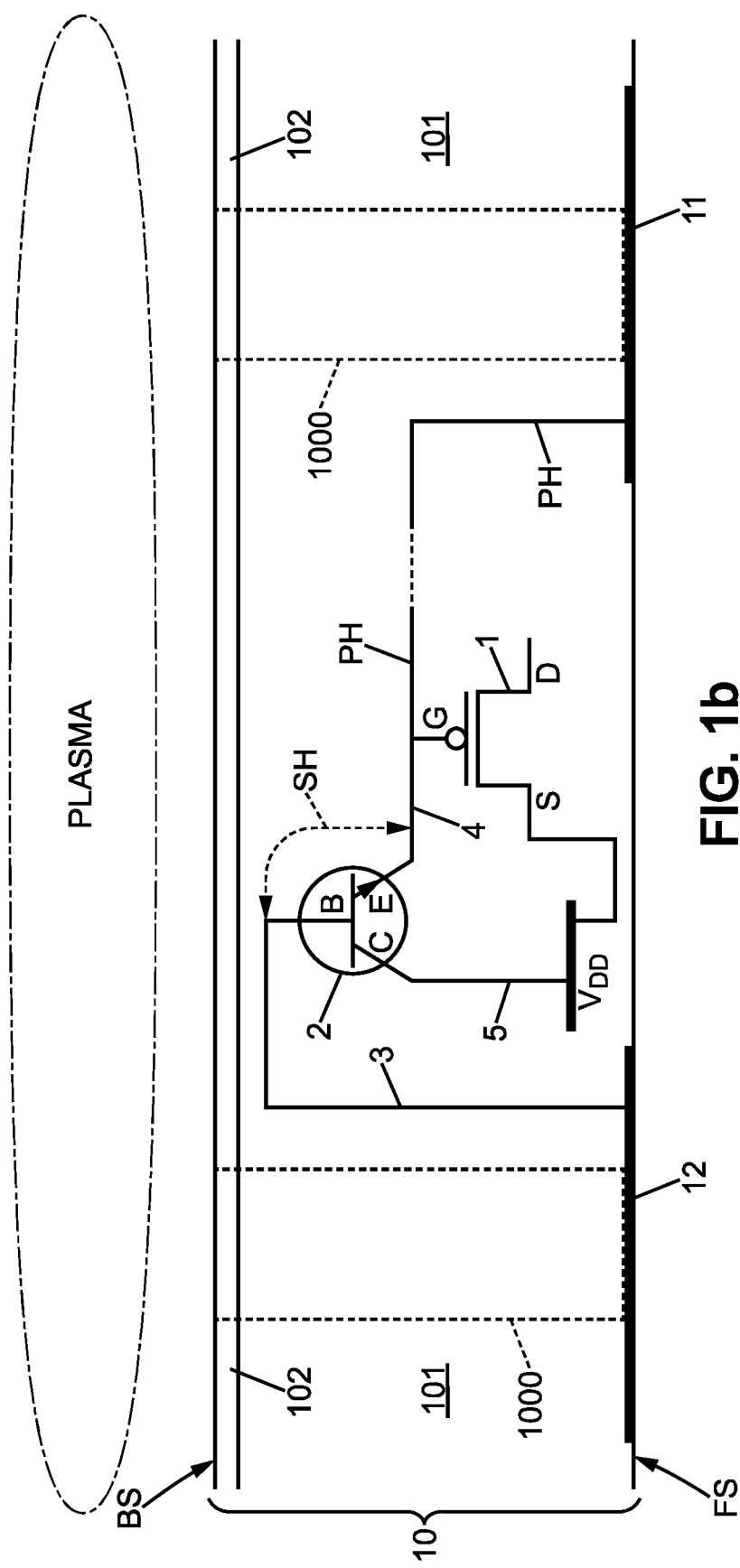
FIG. 1B corresponds to FIG. 1A for a dual embodiment.

FIGS. 1A and 1B relate to a first set of embodiments of the disclosed technology, where the discharge path is comprised of one single bipolar transistor 2. But such exemplary structure for the discharge path must not be construed as a limiting feature of the disclosed technology, since the discharge path may comprise any circuit, including transistor-based multistage circuit which can connect the device port to a reference voltage terminal in a controlled manner.

When the MOS-transistor to be protected is of N-MOS type (FIGS. 1A and 2A), its source terminal may be connected electrically to a low-voltage reference terminal $V_{SS}$, which is internal to the circuit. Alternatively, the source terminal of a P-MOS type transistor (FIGS. 1B and 2B) may be connected electrically to a positive-voltage reference terminal $V_{DD}$, also internal to the circuit. Reference letters D, S and G denote the drain terminal, source terminal and gate for each MOS-transistor 1.

To avoid the charge accumulation on the gate of one MOS-transistor 1, a bipolar transistor 2 is added to the circuit, and arranged to connect electrically the gate G of the MOS-transistor 1 of the device to the reference voltage terminal $V_{SS}$ or $V_{DD}$. A plasma pick-up antenna 12 is further added to the circuit, possibly on the substrate front side surface FS, and connected to the base of the bipolar transistor 2 through a dedicated conducting connection 3, for example, a dedicated metal connection. The plasma pick-up antenna 12 may be located at the bottom of another hole 1000 to be etched, or close to such another hole.

The type PNP or NPN of the bipolar transistor 2 and its connection orientation may be optimized depending on the N-MOS or P-MOS type of the MOS-transistor(s) to be protected, based on doping considerations for the doped regions within the circuit.

In FIG. 1A, the MOS-transistor 1 to be protected is N-MOS, and a PNP bipolar transistor 2 may be preferably used. To this end, the emitter of the bipolar transistor 2 is to be connected to the gate of the MOS-transistor 1 through a conducting connection 4. The conducting connection 4 may be either of metal conduction type or one N-doped zone which is common to the gate of the MOS-transistor 1 and the emitter of the bipolar transistor 2. The collector of the bipolar transistor 2 is to be connected to the reference voltage terminal $V_{SS}$ through a conducting connection 5, so that the $V_{SS}$-terminal acts as a sink to the electric charge which is transferred from the gate of the MOS-transistor 1 to the reference voltage terminal. The bipolar transistor 2 and the connections 4 and 5 thus form the discharge path that has been cited in the general part of this description. During the plasma-processing step, the plasma pick-up antenna 12 accumulates additional electric charge which biases the base of the bipolar transistor 2, thereby activating the bipolar transistor 2 so that the electric charge can flow from the MOS-transistor gate between the emitter and collector of the bipolar transistor 2. The useful area and the shape of the plasma pick-up antenna 12 may be adapted or optimized, for example, in size, position or shape, so that the obtained bias of the base of the bipolar transistor 2 is sufficient for evacuating the electric charge from the MOS-transistor gate at a sinking rate suitable with respect to the charge accumulation rate. Preferably, the charge sinking rate could be equal to the charge accumulation rate. Thanks to the current amplification coefficient beta existing between the base current and the emitter-to-collector current of the bipolar transistor 2, the base current does not need to be large for the sinking rate to be sufficient. As long as the current to be sunk from the gate of the MOS-transistor 1 to the $V_{SS}$-terminal is less than beta times the biasing current which flows into the base of the bipolar transistor 2 from the plasma pick-up antenna 12, the voltage drop between the emitter and the collector is almost zero, and the sinking current is free to flow from the gate of the MOS-transistor 1. This corresponds to saturation of the bipolar transistor 2. If the current from the gate of the MOS-transistor 1 exceeds beta times the biasing current which flows into the base of the bipolar transistor 2, then the excess current accumulates electric charge on the MOS-transistor gate, but in a reduced extent. Maximum protection of the MOS transistor 1 is obtained when the bipolar transistor 2 is designed and sized so as to remain in saturation mode during the whole plasma-processing step, so as to provide a low resistive discharge path.

Figure 3:
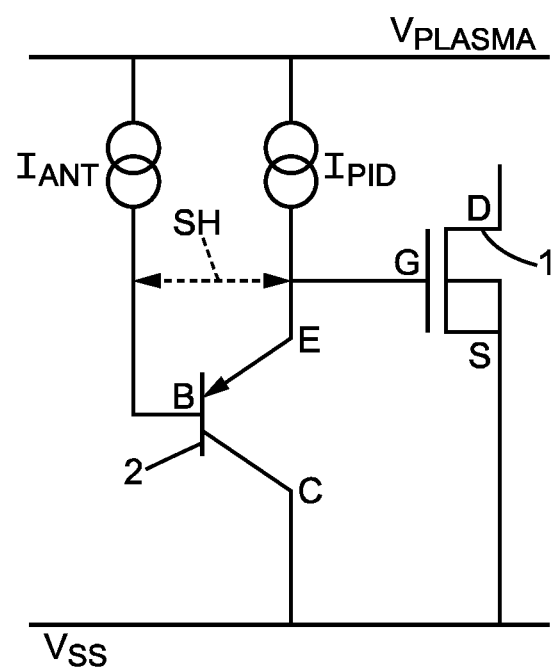
FIG. 3 is an electrical diagram illustrating the protection against Plasma-Induced Damage which is provided by the embodiment of FIG. 1A.

In FIG. 3, the electric charge which may accumulate at the gate of the MOS-transistor 1 during the plasma-processing step is represented as originating from a current generator, with current label $I_{PID}$. In a similar way, the additional electric charge which is collected by the plasma pick-up antenna 12 is represented as originating from another current generator, with current label $I_{ANT}$. In this equivalent diagram, both current generators $I_{PID}$ and $I_{ANT}$ are connected upstream to a voltage source corresponding to the plasma, and labelled $V_{PLASMA}$. Under saturation operation of the bipolar transistor 2, the current $I_{PID}$ flows to the reference voltage terminal $V_{SS}$ through the emitter and collector of the bipolar transistor 2. If saturation of the bipolar transistor 2 is no longer achieved, then the current $I_{PID}$ is higher than beta times the current $I_{ANT}$, and the excess current from the current generator $I_{PID}$ causes the electric charge to accumulate at the MOS-transistor gate.

After the plasma-processing step has ended, a further electrical connection may be added to the circuit to short the base B of the bipolar transistor 2 to its emitter E. For example, such connection may be of back-end-of-line metal connection type, and is shown by an arrow SH in broken line in the figures. For the embodiment of FIGS. 1A and 3, the connection SH further connects the plasma pick-up antenna 12 and the port of the device to each other. Once the connection SH is produced, the base-emitter junction of the bipolar transistor 2 is inhibited, and the bipolar transistor 2 behaves like a diode, whose polarity is the same as the base-collector junction, between the gate of the MOS-transistor 1 and the $V_{SS}$ terminal. Under normal circuit bias conditions, this diode is in blocked state, so that the bipolar transistor 2 does not interfere with the operation of the device in normal use.

The disclosed technology may also be applied to circuits where the respective gates of several N-MOS transistors 1 are to be protected. Then, one protection circuit as described with reference to FIG. 1A may be dedicated to each of the N-MOS transistors to be protected. Possibly, the connection 3 may connect in parallel the bases of several or all of the bipolar transistors 2 to one and same plasma pick-up antenna 12. Thus, the plasma pick-up antenna 12 may be common to all the N-MOS transistors 1 to be protected, and therefore it should be sized and designed appropriately to bias simultaneously all the bipolar transistors 2 so that each of them operates in saturation mode during the plasma-processing step. This allows sinking simultaneously the currents that originate from the gates of all the N-MOS transistors 1. One advantage of sharing one plasma pick-up antenna between several MOS-transistors to be protected is a reduction in the area which is occupied at the surface of the wafer by the protection system, when compared to a total area occupied by a plurality of separate plasma pick-up antennas which are dedicated respectively to the MOS-transistors to be protected. More wafer area thus remains available for components which participate in the intended operation of the device.

In cases where several bipolar transistors 2 are dedicated to protecting respective N-MOS transistors 1 of the device, a separate base-to-emitter connection SH is to be provided to each bipolar transistor 2.

FIG. 1B corresponds to FIG. 1A, except that the MOS-transistor 1 to be protected is now of P-MOS type. Then, the bipolar transistor 2 is preferably of NPN-type, with its collector connected to the $V_{DD}$-terminal of the circuit. Protection operation during the plasma-processing step and also the after-plasma shorting between the base and emitter of the bipolar transistor 2 are identical to those described with reference to FIG. 1A, except the flowing directions of the currents which are inverted.

FIG. 2A illustrates another embodiment of the disclosed technology, where several N-MOS transistors 1 are to be protected with bipolar transistors 2 of NPN-type. Then, a separate NPN bipolar transistor 2 is dedicated to each of the N-MOS transistors 1. The gate of each N-MOS transistor 1 is connected to the collector of the corresponding NPN bipolar transistor 2 through a dedicated connection indicated by the reference sign 4', which is preferably of metal connection type. Generally, the gates of the MOS-transistors should not be shorted together. Then, if the collectors of the bipolar transistors 2 are formed from N-doping wells as this is usual in CMOS technology, such N-doping well should not be shared between several of the NPN bipolar transistors 2. The emitter of each bipolar transistor 2 is connected to the $V_{SS}$-terminal through a metal connection 5', and the connection 3 still connects the plasma pick-up antenna 12 to the bases of the bipolar transistors 2. It is then obvious for one skilled in the art to adapt the explanations which have been provided with reference to FIG. 1A to such configuration as shown in FIG. 2A. The after-plasma shorting between the base and emitter of each bipolar transistor 2 is still the same, except that the connection SH now connects the plasma pick-up antenna 12 to the reference voltage terminal $V_{SS}$ in the final circuit, and no longer to the device port which required protection. But this has no effect with respect to the normal operation of the device.

The embodiment depicted in FIG. 2B corresponds to the one in FIG. 2B, but with the MOS-transistors 1 to be protected of P-MOS type and the bipolar transistors 2 of PNP-type. The gate of each MOS-transistor 1 is connected to the collector of a corresponding one of the bipolar transistors 2 through a conducting connection 4', the emitter of the bipolar transistors 2 are connected to the $V_{DD}$-terminal of the circuit through the connections 5', and the bases of the bipolar transistors 2 are connected again to the plasma pick-up antenna 12 through the connection 3. For such embodiment alternative to that of FIG. 2A, the gate of each MOS-transistor 1 has to be connected to a P-doping well which forms the collector of the corresponding PNP bipolar transistor 2, but which should be separate from the collector-forming P-doping wells of the other bipolar transistors 2. Protection operation during the plasma-processing step and the after-plasma shorting between the base and emitter of each bipolar transistor 2 are identical to those described with reference to FIG. 2A, except the flowing directions of the currents being inverted.

Figure 4A:
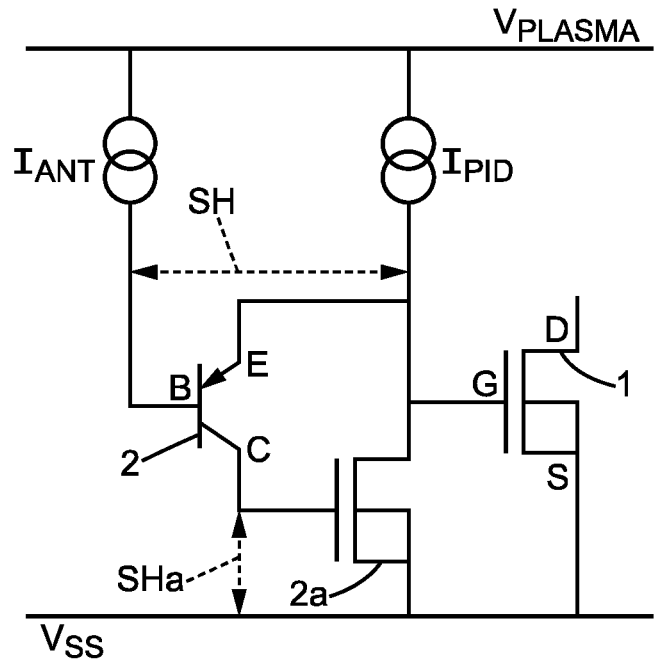
FIGS. 4A and 4B correspond to FIG. 3 for two other embodiments of the disclosed technology, where the discharge path is a two-stage transistor assembly.
Figure 4B:
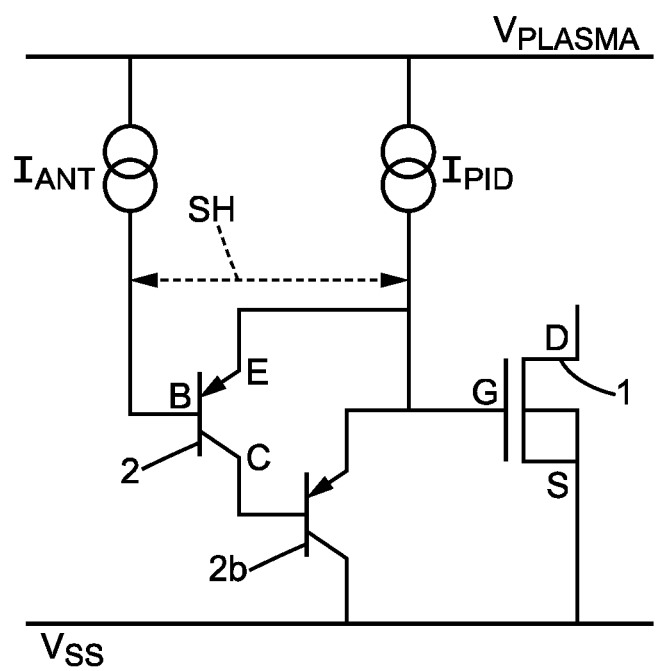

FIGS. 4A and 4B each correspond to FIG. 3, for two further embodiments where the discharge path is a two-stage transistor assembly.

In the embodiment of FIG. 4A, the discharge path comprises a N-MOS transistor 2a which is separate from the PNP bipolar transistor 2. The base of the bipolar transistor 2 forms again the control terminal of the discharge path. To this end, the emitter of the bipolar transistor 2 and the drain of the N-MOS transistor 2a are both connected to the gate of the N-MOS transistor 1 to be protected, the collector of the bipolar transistor 2 is connected to the gate of the N-MOS transistor 2a, and the source of the N-MOS transistor 2a is connected to the reference voltage terminal $V_{SS}$. The base of the bipolar transistor 2 is connected again to the plasma pick-up electrode 12 (not shown in FIG. 4A), corresponding to the current generator $I_{ANT}$ when the plasma process is being applied. In this way, the drain-to-source conduction of the N-MOS transistor 2a is controlled by the voltage which is produced by the collector of the bipolar transistor 2 onto the gate of the N-MOS transistor 2a, depending on the current $I_{ANT}$. When this $I_{ANT}$-current is sufficient, the $I_{PID}$-current is sunk to the reference voltage terminal $V_{SS}$ through the drain-to-source path of the N-MOS transistor 2a, thereby avoiding significant electric charge accumulating at the gate of the MOS-transistor 1. Then, the after-plasma shorting connection SH is to be implemented again between the base and the emitter of the bipolar transistor 2. For the embodiment of FIG. 4A, a second shorting SHa may be implemented additionally between the gate and the source of the N-MOS transistor 2a, so that this N-MOS transistor 2a is maintained in off-state, thereby ensuring low leakage current.

In the embodiment of FIG. 4B, the discharge path comprises an additional PNP bipolar transistor 2b which is separate from the PNP bipolar transistor 2. The base of the bipolar transistor 2 forms again the control terminal of the discharge path. The emitters of the bipolar transistors 2 and 2b are both connected to the gate of the N-MOS transistor 1 to be protected, the collector of the bipolar transistor 2 is connected to the base of the bipolar transistor 2b, and the collector of the bipolar transistor 2b is connected to the reference voltage terminal $V_{SS}$. The base of the bipolar transistor 2 is connected again to the plasma pick-up electrode 12 (not shown in FIG. 4B), corresponding to the current generator $I_{ANT}$ when the plasma process is being applied. In this way, the emitter-to-collector conduction of the bipolar transistor 2b is controlled by the current which is transmitted by the bipolar transistor 2 to the base of the bipolar transistor 2b, depending on the current $I_{ANT}$. When this latter $I_{ANT}$-current is sufficient, the $I_{PID}$-current is sunk to the reference voltage terminal $V_{SS}$ through the emitter-to-collector path of the bipolar transistor 2b, thereby avoiding significant electric charge accumulating at the gate of the MOS-transistor 1. Such assembly of the bipolar transistors 2 and 2b is known as a Darlington pair. The after-plasma shorting connection SH between the base and the emitter of the bipolar transistor 2 is unchanged again.

It is clear that the disclosed technology can be reproduced while adapting or modifying secondary aspects thereof. In particular, the function of the plasma-process which is applied to the circuit substrate may vary, as well as the substrate surface which is exposed to the plasma.

The discharge path may comprise any circuit suitable for sinking electric charge from the device port to the reference voltage terminal, provided it is controlled by a terminal which is connected to the plasma pick-up antenna.

Additionally, the disclosed technology further allows locating the plasma pick-up antenna at various places within integrated circuit boundaries, with respect to the device to be protected. In particular, the plasma pick-up antenna may be located outside the active area of the device.

What is claimed is:
1. A semiconductor integrated circuit comprising:
a semiconductor device having a port to be protected from Plasma-Induced Damage due to electric charge that may accumulate at the port during a plasma-processing step which is applied to the semiconductor integrated circuit;

a protection circuit comprising:
   a discharge path arranged to electrically connect the port to a reference voltage terminal;
   a control terminal, adapted to activate or deactivate the discharge path, so that the electric charge is respectively allowed to flow or prevented from flowing from the port to the reference voltage terminal through the discharge path; and
   a plasma pick-up antenna connected to the control terminal and arranged to accumulate additional electric charge during the plasma-processing step; and at least one substrate which is provided with at least one through-substrate via, wherein the through-substrate via is located within the semiconductor integrated circuit so that plasma-processing the substrate to produce the through-substrate via may cause the electric charge to accumulate at the port of the semiconductor device and the additional electric charge to accumulate at the plasma pick-up antenna, wherein the protection circuit further comprises a bipolar transistor, the bipolar transistor having a base which is connected to the control terminal, such that when the plasma pick-up antenna accumulates the additional electric charge the control terminal is biased and the discharge path is activated, thereby protecting the port of the semiconductor device.

2. The semiconductor integrated circuit according to claim 1, wherein the discharge path comprises at least one path segment formed of a drain-to-source path of a MOS transistor or of a collector-to-emitter path of a bipolar transistor.

3. The semiconductor integrated circuit according to claim 2, wherein the port to be protected comprises a gate of an N-MOS-transistor, and the bipolar transistor which has its base connected to the control terminal is of PNP type.

4. The semiconductor integrated circuit according to claim 2, wherein the port to be protected comprises a gate of a P-MOS-transistor, and the bipolar transistor which has its base connected to the control terminal is of NPN type.

5. The semiconductor integrated circuit according to claim 2, wherein the port to be protected comprises a gate of an N-MOS-transistor, and the bipolar transistor which has its base connected to the control terminal is of NPN type.

6. The semiconductor integrated circuit according to claim 2, wherein the port to be protected comprises a gate of a P-MOS-transistor, and the bipolar transistor which has its base connected to the control terminal is of PNP type.

7. The semiconductor integrated circuit according to claim 2, further comprising a metal connection arranged to short the base of the bipolar transistor to an emitter of the bipolar transistor.

8. The semiconductor integrated circuit according to claim 1, wherein the port to be protected comprises a gate of an N-MOS-transistor, and the bipolar transistor which has its base connected to the control terminal is of PNP type.

9. The semiconductor integrated circuit according to claim 1, wherein the port to be protected comprises a gate of a P-MOS-transistor, and the bipolar transistor which has its base connected to the control terminal is of NPN type.

10. The semiconductor integrated circuit according to claim 1, wherein the port to be protected comprises a gate of an N-MOS-transistor, and the bipolar transistor which has its base connected to the control terminal is of NPN type.

11. The semiconductor integrated circuit according to claim 1, wherein the port to be protected comprises a gate of a P-MOS-transistor, and the bipolar transistor which has its base connected to the control terminal is of PNP type.

12. The semiconductor integrated circuit according to claim 1, further comprising a metal connection arranged to short the base of the bipolar transistor to an emitter of the bipolar transistor.

13. The semiconductor integrated circuit according to claim 12, wherein the metal connection is located on a backside of the substrate of the semiconductor integrated circuit, which is opposite a front side of the substrate where the semiconductor device is located.

14. The semiconductor integrated circuit according to claim 1, further comprising:
   one or more semiconductor devices, each having a port to be protected from Plasma-Induced Damage due to electric charge that may accumulate at the port during a plasma-processing step which is applied to the semiconductor integrated circuit;
   one or more discharge paths, each arranged to electrically connect the respective port to the reference voltage terminal, and each configured to be activated or deactivated by the control terminal, so that the electric charge is respectively allowed to flow or prevented from flowing from the port to the reference voltage terminal through the discharge path;
   one or more bipolar transistors, each having a base which is connected to the control terminal, such that when the plasma pick-up antenna accumulates the additional electric charge the control terminal is biased and the respective discharge path is activated, thereby protecting the port of the respective semiconductor device.

15. The semiconductor integrated circuit according to claim 14, further comprising one or more metal connections, each arranged to short the base to an emitter of the respective bipolar transistor.

16. The semiconductor integrated circuit according to claim 1, further comprising:
   a MOS transistor, wherein a drain of the MOS transistor is connected to the port of the semiconductor device to be protected, a source of the MOS transistor is connected to the reference voltage terminal, and a gate of the MOS transistor is connected to a collector or emitter of the bipolar transistor; and
   an additional discharge path formed of a drain-to-source path of the MOS transistor.

17. The semiconductor integrated circuit according to claim 16, further comprising an additional metal connection arranged to short the gate and the source of the MOS transistor.

18. The semiconductor integrated circuit according to claim 1, further comprising:
   an additional bipolar transistor, wherein an emitter of the additional bipolar transistor is connected to the port of the semiconductor device to be protected, a collector of the additional bipolar transistor is connected to the reference voltage terminal, and a base of the additional bipolar transistor is connected to a collector or emitter of the bipolar transistor; and
   an additional discharge path formed of an emitter-to-collector path of the additional bipolar transistor.

19. A process of manufacturing a semiconductor integrated circuit which comprises a semiconductor device having a port to be protected from Plasma-Induced Damage due to electric charge that may accumulate at the port during a plasma-processing step which is applied to the semiconductor integrated circuit, the process comprising the following steps:
1) forming a protection circuit as part of the semiconductor integrated circuit, the protection circuit comprising:
   a discharge path arranged to electrically connect the port to a reference voltage terminal;
   a control terminal, adapted to activate or deactivate the discharge path, so that the electric charge is respectively allowed to flow or prevented from flowing from the port to the reference voltage terminal through the discharge path; and
   a plasma pick-up antenna connected to the control terminal, and thereafter,
2) plasma-processing the semiconductor integrated circuit,
   the plasma pick-up antenna being arranged so that the plasma pick-up antenna accumulates additional electric charge during step 2),
   wherein the protection circuit further comprises a bipolar transistor, the bipolar transistor having a base which is connected to the control terminal, such that in step 2), when the plasma pick-up antenna accumulates the additional electric charge the control terminal is biased and the discharge path is activated, thereby protecting the port of the semiconductor device,
   wherein step 2) is a plasma-etching step, and
   wherein the semiconductor integrated circuit further comprises at least one substrate, the plasma-etching step is performed to produce at least one through-substrate via, the through-substrate via being located within the semiconductor integrated circuit so that plasma-etching the substrate may cause the electric charge to accumulate at the port of the semiconductor device and the additional electric charge to accumulate at the plasma pick-up antenna.

20. The process according to claim 19, wherein the semiconductor integrated circuit further comprises a metal portion which is located within the circuit and causes the electric charge to be transmitted to the port of the semiconductor device during the plasma-processing of step 2), the metal portion existing in the circuit before step 2), or being produced or modified during step 2), or being exposed to the plasma from one time during the plasma-processing of step 2).

21. The process according to claim 19, further comprising the following step carried out after step 2):
3) electrically shorting an emitter of the bipolar transistor to the base of the bipolar transistor.

22. The process according to claim 21, wherein a connection which is arranged in step 3) to short the emitter of the bipolar transistor to the base of the bipolar transistor is metal, and is located on a backside of the substrate of the semiconductor integrated circuit, which is opposite a front side of the substrate where the semiconductor device is located.

23. The process according to claim 19, wherein the semiconductor integrated circuit further comprises one or more semiconductor devices, each having a port to be protected from Plasma-Induced Damage due to electric charge that may accumulate at the port during a plasma-processing step which is applied to the semiconductor integrated circuit, and wherein step 1) further comprises forming:
   one or more discharge paths, each arranged to electrically connect the respective port to the reference voltage terminal; and
   one or more bipolar transistors, each having a base which is connected to the control terminal, such that in step 2), when the plasma pick-up antenna accumulates the additional electric charge the control terminal is biased and the respective discharge path is activated, thereby protecting the port of the respective semiconductor device.

24. The process according to claim 23, further comprising the following step carried out after step 2):
3) electrically shorting an emitter to the base of each of the bipolar transistors.

25. The process according to claim 19, wherein the protection circuit of step 1) further comprises:
   a MOS transistor, wherein a drain of the MOS transistor is connected to the port of the semiconductor device to be protected, a source of the MOS transistor is connected to the reference voltage terminal, and a gate of the MOS transistor is connected to a collector or emitter of the bipolar transistor; and
   an additional discharge path formed of a drain-to-source path of the MOS transistor.

26. The process according to claim 25, further comprising the following step carried out after step 2):
3) electrically shorting the emitter of the bipolar transistor to the base of the bipolar transistor, and electrically shorting the gate and the source of the MOS transistor.

27. The process according to claim 19, wherein the protection circuit of step 1) further comprises:
   an additional bipolar transistor, wherein an emitter of the additional bipolar transistor is connected to the port of the semiconductor device to be protected, a collector of the additional bipolar transistor is connected to the reference voltage terminal, and a base of the additional bipolar transistor is connected to a collector or emitter of the bipolar transistor; and
   an additional discharge path formed of an emitter-to-collector path of the additional bipolar transistor.

* * * * *